(12) United States Patent
Gehringer et al.

(10) Patent No.: US 8,522,302 B2
(45) Date of Patent: Aug. 27, 2013

(54) ADAPTIVE POWER CONTROL FOR CATV SYSTEMS

(75) Inventors: Phil Gehringer, Bellefonte, PA (US); Bruce Campbell, Bellefonte, PA (US); Mike Fedorchak, Bellefonte, PA (US)

(73) Assignee: Arris Enterprises, Inc., Suwanee, GA (US)

( * ) Notice: Subject to any disclaimer, the term of this patent is extended or adjusted under 35 U.S.C. 154(b) by 110 days.

(21) Appl. No.: 13/056,991

(22) PCT Filed: Jul. 31, 2009

(86) PCT No.: PCT/US2009/052414
§ 371 (c)(1),
(2), (4) Date: Feb. 1, 2011

(87) PCT Pub. No.: WO2010/017106
PCT Pub. Date: Feb. 11, 2010

(65) Prior Publication Data
US 2011/0141373 A1 Jun. 16, 2011

Related U.S. Application Data

(60) Provisional application No. 61/085,741, filed on Aug. 1, 2008.

(51) Int. Cl.
*H04N 7/16* (2011.01)

(52) U.S. Cl.
USPC .......................................... 725/149; 725/150

(58) Field of Classification Search
USPC .................................................. 725/149–150
See application file for complete search history.

(56) References Cited

U.S. PATENT DOCUMENTS
2007/0015475 A1* 1/2007 Schoofs et al. ............ 455/127.1

FOREIGN PATENT DOCUMENTS
EP 2319181 A1 5/2011
WO 2010017106 A1 2/2010

OTHER PUBLICATIONS

Preliminary Report on Patentability dated Feb. 10, 2011 from the International Bureau for Application PCT/US2009/052414 filed Jul. 31, 2009.

* cited by examiner

*Primary Examiner* — Hunter B Lonsberry
(74) *Attorney, Agent, or Firm* — Troy A. Van Aacken

(57) ABSTRACT

Methods, systems, and apparatus can be used to provide adaptive power control in CATV systems. In various examples, adaptive power control can adjust the power output to amplifiers based upon the load of a communication signal being amplified. The power output can be calculated to maintain specified performance levels for amplification of the communication signal.

20 Claims, 4 Drawing Sheets

ADAPTIVE POWER CONTROL FOR CATV SYSTEMS

RELATED APPLICATIONS

This application claims priority under 35 U.S.C. §119(e) to the filing date and benefit of International Application Serial No. PCT/US09/52414, entitled "Adaptive Power Control for CATV Systems," filed Jul. 31, 2009, which claims priority to U.S. Provisional Patent Application Ser. No. 61/085,741, entitled "Adaptive Power Control of a CATV Device," filed Aug. 1, 2008, both of which are incorporated herein by reference as if set forth herein in their entirety.

TECHNICAL FIELD

This disclosure relates to amplification of signals.

BACKGROUND

The Data-Over-Cable Service Interface Specification (DOCSIS) was established by cable television network operators to facilitate transporting data traffic, primarily Internet traffic, over existing community antenna television (CATV) networks. In addition to transporting data traffic, as well as television content signals over a CATV network, multiple services operators (MSO) also use their CATV network infrastructure for carrying voice, video on demand (VoD) and video conferencing traffic signals, among other types. DOCSIS (and the variant Euro-DOCSIS) provides for many 6 MHz (or 8 MHz in Euro-DOCSIS) channels over an assigned RF spectrum.

The RF signals generated by DOCSIS devices are communicated to subscribers through a hybrid fiber-coax (HFC) network. However, over long distances, these RF signals tend to degrade based upon the propagation characteristics of the media. Thus, amplifiers (e.g., including repeaters) can be placed regularly throughout the network to amplify the RF signals, thereby counteracting the degradation of the RF signal. However, each amplifier consumes power, leaving the MSO with significant overhead expenses for operating the network.

SUMMARY

Briefly described, and based upon an example implementation, this disclosure describes systems and methods used to provide adaptive power control to communication signals. One example method of providing adaptive power control can include: receiving a communication signal; identifying loading characteristics of the received communication signal; identifying performance parameters of a device based upon the loading characteristics of the signal; and setting power drawn by the device based upon the identified performance requirements.

An example adaptive power control system can include a broadband power detector, processing logic and a control signal generator. The broadband power detector can receive a communication signal and identify loading characteristics of the communication signal. The processing logic can receive the loading characteristics of the communication signal and calculate performance parameters of an amplifier based upon the loading characteristics of the signal. The control signal generator can set power drawn by the amplifier based upon the identified performance requirements received from the processing logic.

Other systems, methods, and features of this disclosure will be or become apparent to one with skill in the art upon examination of the following drawings and detailed description. It is intended that all such additional systems, methods, and features be included within this description and be within the scope of the present disclosure.

BRIEF DESCRIPTION OF THE DRAWINGS

Like reference numbers and designations in the various drawings can indicate similar elements.

DETAILED DESCRIPTION

In some implementations of this disclosure, systems and method can be used to provide adaptive power control to devices (e.g., including amplifiers, nodes and repeaters) in a communications network. In various implementations, an adaptive power control device can be used to detect the loading of a communication signal. Based upon the loading of the communication signal, the adaptive power control device can generate control signals to the device to control the power drawn by amplification of the communication signal. Such systems and methods can achieve significant power savings by reducing the power consumed by the device when a communications signal is lightly loaded by an MSO. While many of the implementations described herein will refer to use of the adaptive power control in amplifiers, the concepts can be broadly applied to other devices (such as, e.g., repeaters and nodes) in a hybrid fiber coax (HFC) network which amplify and/or reproduce signals for transmission within the network.

Figure 1:
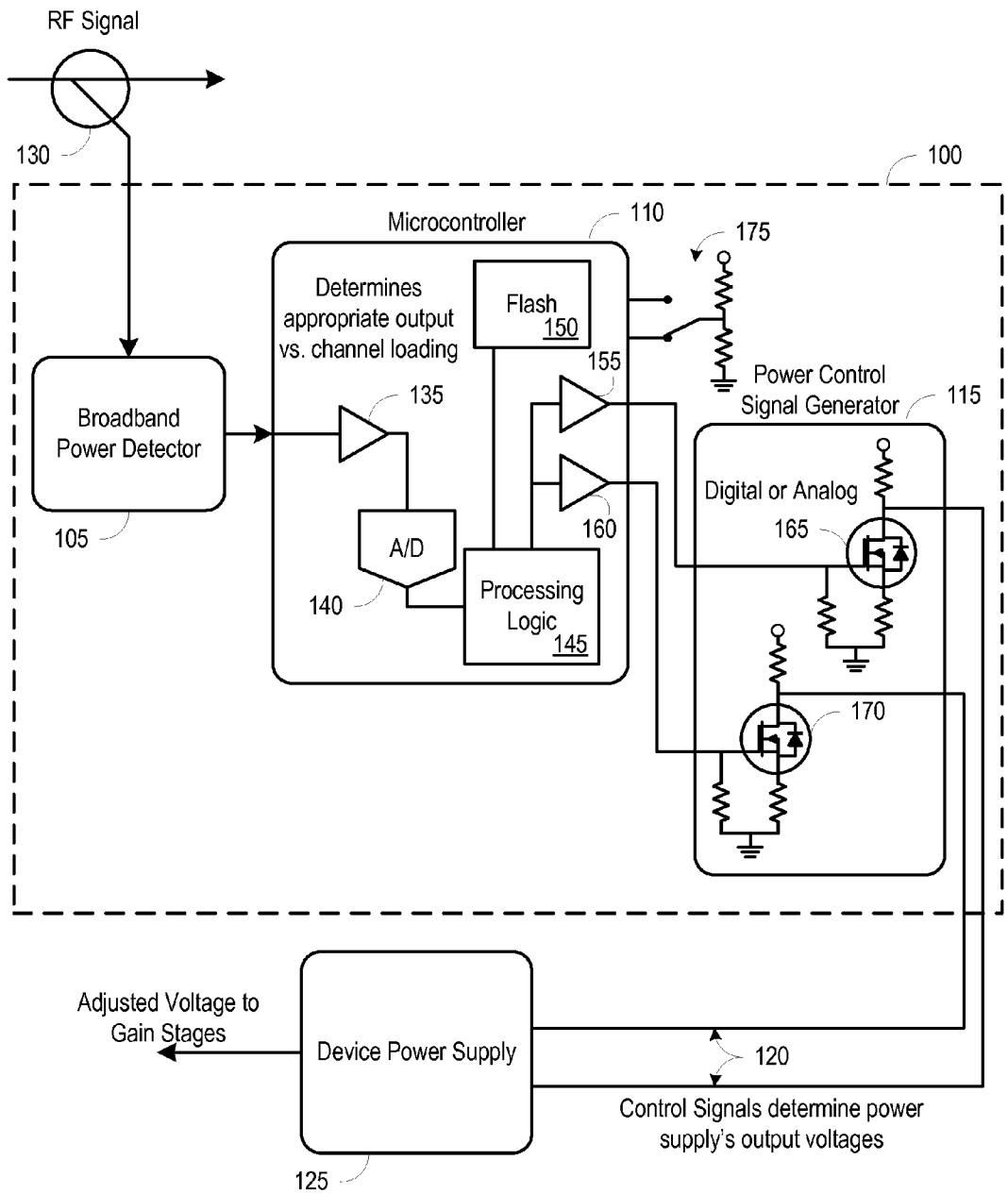
FIG. 1 is a block diagram illustrating an example adaptive power control device.

FIG. 1 is a block diagram illustrating an example adaptive power control device 100. In some implementations, the adaptive power control device 100 can include a broadband power detector 105, a micro controller 110, and a power control signal generator 115. The adaptive power control device 100 can provide power supply control signals 120 to a device power supply 125.

In various implementations, the device power supply 125 and/or the amplifier (not shown) can be internal or external to the adaptive power control device 100. In some implementations, the power supply control signals 120 can operate to control the output voltage of the device power supply 125. In turn the output voltage of the power supply 125 can operate to control the power output of an amplifier used to amplify a communication signal (e.g., a radio frequency (RF) communication signal). However, it should be understood that in other implementations, the current consumed by the amplifier can be used to optimize the power consumed by the gain stages of the amplifier.

The adaptive power control device 100 can receive the communication signal from a splitter 130. Although it is shown as a separate component in this example, in some implementations, the splitter 130 can be included internal to the adaptive power control device 100. The splitter 130 operates as a passive device providing the adaptive power control device 100 with a sample of the communication signal. In other implementations, the splitter 130 can be an active device operable to replicate the communication signal for the adaptive power control device 100.

The broadband power detector 105 can operate to receive a communication signal from the splitter 130. In some implementations, the broadband power detector 105 can measure the power present in the communication signal received from the splitter 130. Based upon the power present in the communications signal, the broadband power detector 105 can provide an indication of the load on the communications signal (e.g., the number of channels being utilized on the line by the MSO). In other implementations, the signal itself might include loading information about the signal, identifying how many channels are being utilized by the communication signal. In still further implementations, the signal itself can include power settings operable to notify the adaptive power control of the proper power settings for the signal.

The microcontroller 110 can be operable to receive an indication from the broadband power detector 105 of the loading of the communications signal. In some implementations, the microcontroller 110 can include an input buffer 135, an analog-to-digital (A/D) converter 140, processing logic 145, a flash memory 150, and output buffers 155, 160.

Input buffer 135 can be used to insulate the microcontroller 110 from the power components external to the controller. In some implementations, the input buffer 135 can receive a direct current (DC) voltage level from the broadband power detector and convert the DC voltage level to transistor-transistor logic (TTL) signals used by the microcontroller 110.

The A/D converter 140 can operate to convert the incoming voltage information to a digital signal for the processing logic 145. The processing logic 140 can use the digital signal from the A/D converter 140 to perform a calculation to determine what output voltage the power supply should produce to generate an adequate performance level in the amplification of the communication signal. In some examples, the processing logic can include an arithmetic logic unit (ALU). In other examples, the processing logic can include any of: a processor, a controller, discrete logic, a programmable logic array such as, for example, a field-programmable gate array (FPGA), or any other processing logic operable to perform the output voltage calculation described above.

In some implementations, the processing logic 145 can retrieve previous parameters from the flash memory 150 to identify performance of the amplifier and adjust output voltages based upon the identified performance of the amplifier. In additional implementations, the processing logic 145 can also store output parameters in the flash memory 150. The output parameters stored in flash memory 150 can be later used by the processing logic 145 to adjust the output voltages based upon past performance of the amplifier. In other examples, the output parameters can be stored in the flash memory 150 to facilitate remote monitoring of the performance of the network and power consumption associated with the amplifier and/or adaptive power control device.

Output buffers 155, 160 can serve as drivers to drive TTL control signals produced by the processing logic 145. The TTL control signals driven by the output buffers 155, 160 can be communicated to the power control signal generator 115 which can be used to produce the voltage control signals 120 output to the device power supply 125. The power control signal generator 125 can include voltage control circuits 165 and 170, operable to produce the control signals 120 output to the device power supply 125. As discussed above, the control signals 120 can be used by the device power supply 125 to control the input voltage for the amplifier. The input voltage to the amplifier can control the power output of the amplifier without altering the gain of the amplifier, which can be controlled by the current. However, it should be understood that the current can also be adjusted to control the power drawn by the amplifier.

In some implementations, adaptive power control devices can include a manual override component 175. The manual override component can operate to disable the microcontroller, such that the power supply is run at full power (e.g., producing full voltage). In some implementations, the manual override component can be a jumper. In other implementations, the manual override component can be a switch on the device or a register within the flash memory operable to instruct the processing logic to produce control signals resulting in full voltage production by the power supply 125.

Figure 2:
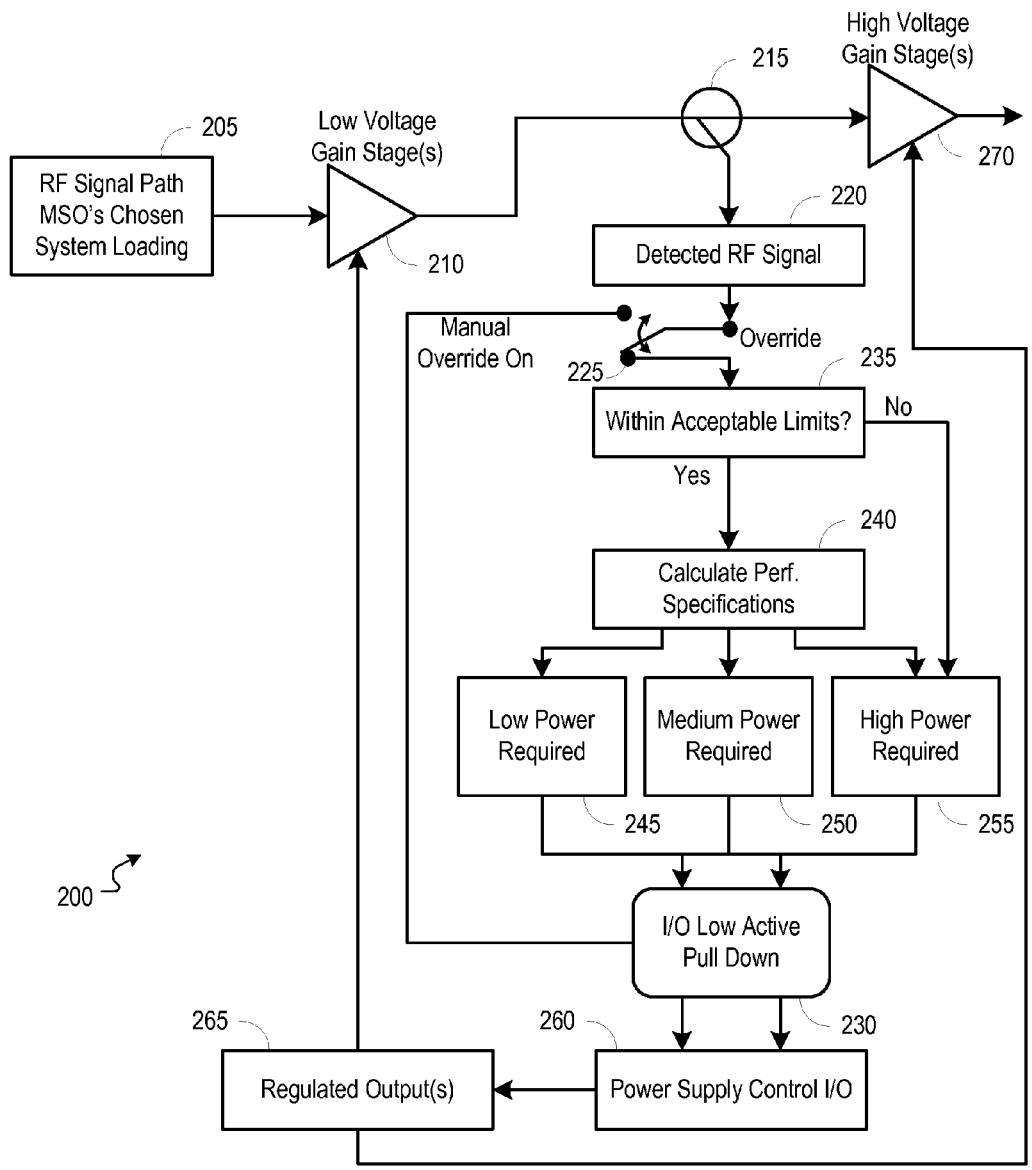
FIG. 2 is a block diagram illustrating an example hybrid flow for an adaptive power control device.

FIG. 2 is a block diagram illustrating a hybrid flow 200 for an adaptive power control device. The flow 200 can begin at stage 205, where an RF signal path having an MSO's chosen loading characteristics is input into the system. The input of the RF signal path with loading characteristics can be input into the system, for example, by a splitter (e.g., splitter 130 of FIG. 1) or a broadband power detector (e.g., broadband power detector 105 of FIG. 1). In some implementations, the entire RF signal can be input into an adaptive power control device. In other implementations, the characteristics of the RF signal can be used as input into an adaptive power control device.

At stage 210, the input the RF signal passes through a low voltage gain stage. The low voltage gain stage can be provided, for example, by an amplification module. In some implementations, the adaptive power control device can be part of the amplifier. In other implementations, the adaptive power control device can be separated from the amplifier. At stage 215, the output of the low voltage gain stage can be split. The output of the low voltage gain stage can be split, for example, by a splitter.

At stage 220, the detected loading of the RF signal can be generated. The detected loading of the RF signal can be generated, for example, by a broadband power detector (e.g., broadband power detector 105 of FIG. 1). In some examples, the broadband power detector can detect the number of channels within the RF signal. In other examples, the broadband power detector can detect the number of channels within the RF signal as well as the extent to which those channels are being driven. In some implementations, the loading of the RF signal can also depend on whether the channels within the signal are digital or analog.

At stage 225 it is determined whether a manual override switch is activated. The manual override switch can be provided, for example, by a manual override component (e.g., manual override component 175 of FIG. 1). If the manual override switch is engaged, the flow 200 proceeds to I/O low active pulldown stage 230.

If the manual override switch is not engaged (as shown in flow 200), the flow 200 proceeds to determine whether the signal is within acceptable limits at stage 235. The determination whether the signal is within acceptable limits can be made, for example, by processing logic (e.g., processing logic 145 of FIG. 1). When the signal is not within acceptable limits, the flow 200 proceeds to stage 255 where a high power control signal is produced.

However, if the signal is within acceptable limits, the flow 200 proceeds to stage 240, where the performance specifications are calculated. If low power performance is specified by the input signal loading, then the flow 200 proceeds to stage 245 where control signals specifying low power are produced. If medium power performance is specified by the input signal loading, then the flow 200 proceeds to stage 250 where control signals specifying medium power are produced. If high power performance is specified by the input signal, the flow 200 proceeds to stage 255 where control signals specifying high power are produced. Stages 240-255 can be performed for example, by processing logic (e.g., processing logic 145 of FIG. 1) in conjunction with a power control signal generator (e.g., power control signal generator 115 of FIG. 1) and a power supply (e.g., power supply 125 of FIG. 1).

The flow 200 then proceeds through the low active pull-down stage 230, where the control signals are biased towards full power absent a signal from a microcontroller (e.g., microcontroller 110 of FIG. 1). The control signals can be biased towards full power, for example, by a power control signal generator (e.g., power control signal generator 115 of FIG. 1, in conjunction with control signal circuits 165, 170).

The flow 200 then proceeds to stage 260, where power supply control I/O are produced. The power supply control I/O can be produced, for example, by a power control signal generator (e.g., power control signal generator 115 of FIG. 1, in conjunction with control signal circuits 165, 170).

The control signals can be provided to stage 265 where regulated outputs are produced. The regulated outputs can be produced, for example, by a power supply (e.g., power supply 125 of FIG. 1). In some implementations, the regulated outputs can include two voltages. The regulated outputs can, in turn, be supplied to low voltage gain stage 210 to adjust the low voltage gain of the amplifier, and to high voltage gain stage 270 to adjust the high voltage gain of the amplifier. The low voltage gain stage can provide feedback into the system to analyze performance of the amplifier and/or adaptive power control device. The output of the high voltage gain stage can be provided to the HFC network to communicate the signal to the next node in the network.

Figure 3:
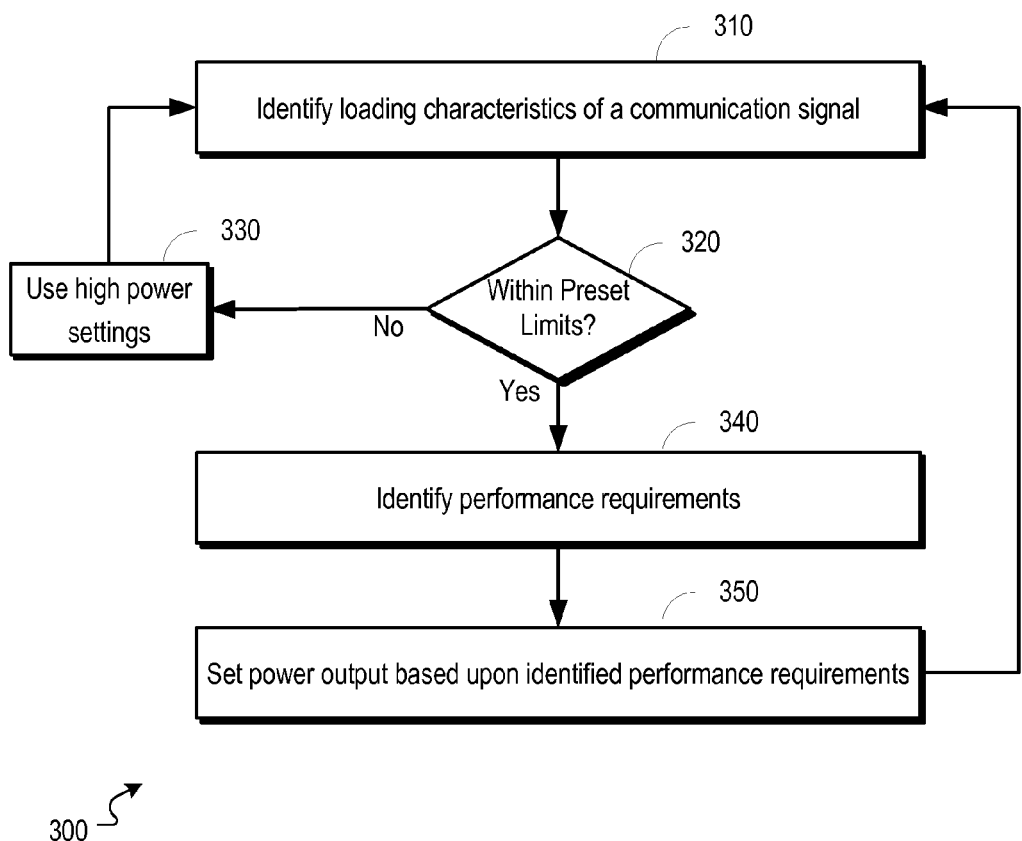
FIG. 3 is a flowchart illustrating an example process for providing adaptive power control for an amplifier.

FIG. 3 is a flowchart illustrating an example process 300 for providing adaptive power control for an amplifier. The process 300 begins at stage 310, where the loading characteristics of a communication signal are identified. The loading characteristics of the communication signal can be identified, for example, by a broadband power detector (e.g., broadband power detector 105 of FIG. 1). In some implementations, the identification of the loading characteristics of the communication signal can be based upon the power level of the signal across a spectrum of channels. In other implementations, the loading characteristics of the communication signal can be based upon a loading information field within the communication signal itself. The loading information field, for example, can be set by the MSO during the generation of the communication signal. In still further implementations, the loading characteristics of the communication signal can be communicated to the adaptive power control device via signaling independent of the communication signal from a central location.

At stage 320, a determination is made whether the communication signal is within preset limits. The determination of whether the communication signal is within preset limits can be made, for example, by processing logic (e.g., processing logic 145 of FIG. 1). In some implementations, the preset limits can define a loading range into which the communication signal falls that is operable to use the adaptive power control device. If the characteristics of the communication signal are not within preset limits, high power settings or the control signals are used at stage 330. The high power settings can be set for the control signals, for example, by processing logic (e.g., processing logic 145 of FIG. 1).

At stage 340, performance requirements are identified. Performance requirements can be identified, for example, by processing logic (e.g., processing logic 145 of FIG. 1). In some implementations, the performance requirements can be identified from the loading characteristics of the communication signal by calculating control signals operable to produce a specified output power from the amplifier based upon adjustment of the output voltage of a power supply. In additional implementations, input may be received from a remote location to adjust the power requirements of an amplifier.

At stage 350, the power drawn by the amplifier is set based upon the identified performance requirements. The power drawn by the amplifier can be set, for example, by a control signal generator (e.g., power control signal generator 115 of FIG. 1) in conjunction with a power supply (e.g., power supply 125 of FIG. 1). In some implementations, a power supply controls the power output of the amplifier by adjusting the voltage input to the amplifier gain stage(s).

Figure 4:
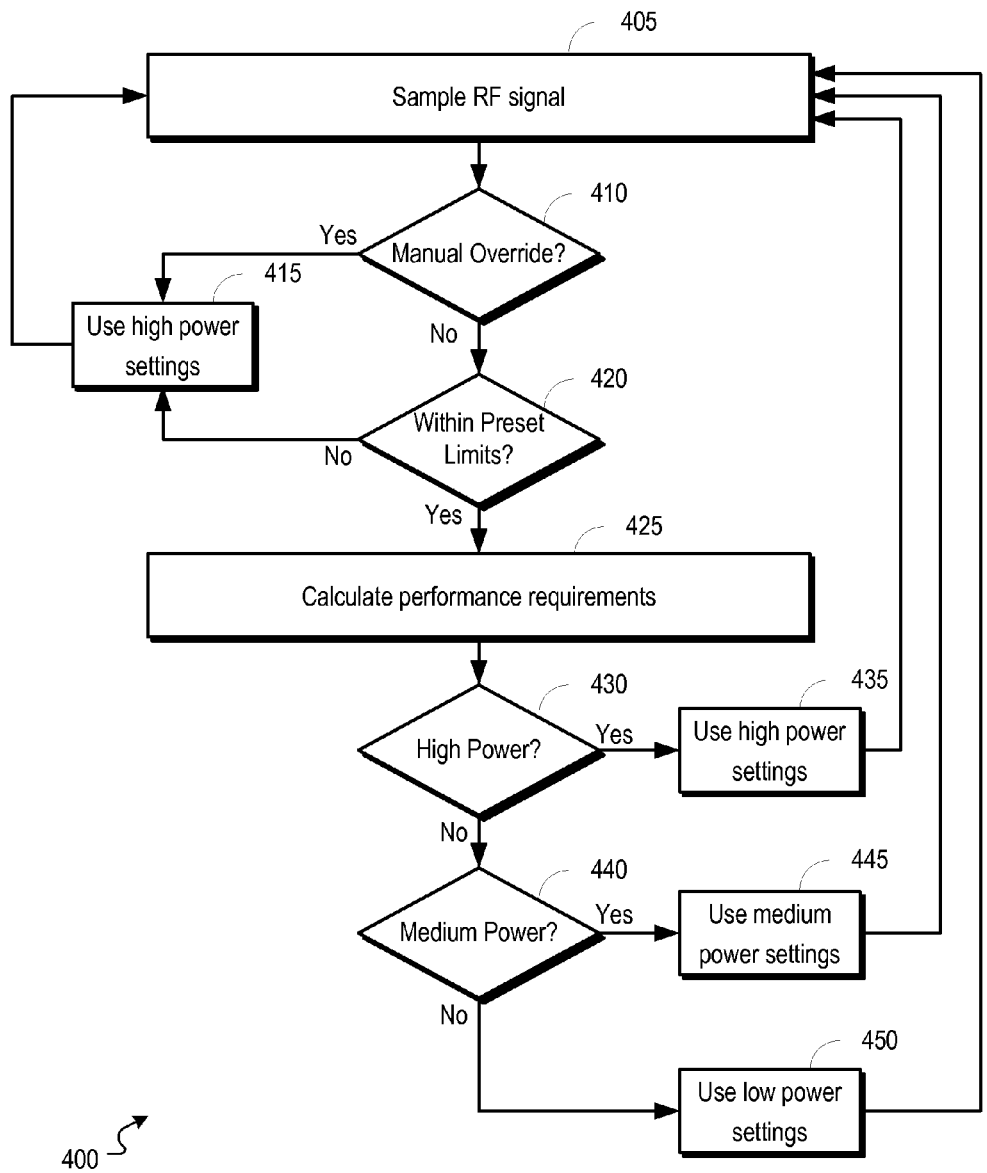
FIG. 4 is a flowchart illustrating another example process for providing adaptive power control an amplifier.

FIG. 4 is a flowchart illustrating another example process 400 for providing adaptive power control an amplifier. At stage 405, an RF signal is sampled. The sampling of the RF signal can be performed, for example, by a broadband power detector (e.g., broadband power detector 105 of FIG. 1). In some implementations, sampling of the RF signal can be used to identify loading characteristics of the RF signal. The loading characteristics of the RF signal can provide a rough estimation of the number and/or type of channels being utilized by the MSO, as well as an estimation of how the channels are being driven.

At stage 410, a determination is made whether a manual override is engaged. The determination of whether the manual override is engaged can be provided, for example, by a manual override component (e.g., manual override component 175 of FIG. 1). In various implementations, the manual override can be provided by a switch, a jumper, a signal set in a memory, etc. If the manual override is set, high power settings are used as stage 415. The high power settings can be used, for example, by processing logic (e.g., processing logic 145 of FIG. 1) in conjunction with a power control signal generator (e.g., power control signal generator 115 of FIG. 1). The process 400 can return to stage 405 to sample the RF signal to restart the process after setting the power control settings to the high power settings.

If the manual override is not engages, the process 400 proceeds to stage 420 where it is determined whether the RF signal is within preset limits. The determination of whether the RF signal is within preset limits can be made, for example, using processing logic (e.g., processing logic 145 of FIG. 1). In some implementations, the preset limits can define a loading range into which the communication signal falls that is operable to use the adaptive power control device. If the RF signal is not within preset limits, high power settings or the control signals are used at stage 415. The high power settings can be set for the control signals, for example, by processing logic (e.g., processing logic 145 of FIG. 1). The process 400 can return to stage 405 to sample the RF signal to restart the process after setting the power control settings to the high power settings.

If the load characteristics of the RF signal is within the preset limits, the process 400 continues at stage 425 by calculating the performance requirements for the RF signal. In some implementations, the performance requirements can be identified by calculating control signals operable to produce a specified output power from the amplifier based upon adjustment of the output voltage of a power supply. In additional implementations, input may also be received from a remote location to adjust the power requirements of an amplifier.

At stage 430, a determination is made whether high performance control signals are implicated by the calculation. If high performance control signal are implicated by the calculation, high power settings can be used at stage 435. The process 400 can return to stage 405 to sample the RF signal to restart the process after setting the power control settings to the use the high power settings.

If high power settings are not used, the process 400 continues to stage 440, a determination is made whether medium performance control signals are implicated by the calculation. If medium performance control signals are implicated by the calculation, medium power control settings can be used at stage 445. The process 400 can return to stage 405 to sample the RF signal to restart the process after setting the power control settings to the use the medium power control settings.

If medium power settings are not used, the process 400 continues to stage 450 to use low power settings. The process 400 can return to stage 405 to sample the RF signal to restart the process after setting the power control settings to the use the low power settings. The process 400 can continue to monitor the RF signal to identify changes in the RF signal loading characteristics by return of the process 400 to stage 405 after setting power settings for a previous sample of the RF signal.

In various implementations, the adaptive power control of this disclosure can be co-located with the amplifier or can remotely provide control information to a power supply associated with the amplifier. In additional or alternative implementations, the adaptive power control of the RF signal can work to selectively power the loaded channels to a specified level, instead of over-driving all devices in the system by driving the power supply at full supply voltage.

In some implementations, the amplifiers and/or adaptive power control devices of this disclosure, and components thereof, can be realized by instructions that upon execution cause one or more processing devices to carry out the processes and functions described above. Such instructions can, for example, comprise interpreted instructions, such as script instructions, e.g., JavaScript or ECMAScript instructions, or executable code, or other instructions stored in a computer readable medium.

Implementations of portions of the subject matter and the functional operations described in this specification can be provided in digital and/or analog electronic circuitry, or in computer software, firmware, or hardware, including the structures disclosed in this specification and their structural equivalents, or in combinations of one or more of them. Embodiments of portions of the subject matter described in this specification can be implemented as one or more computer program products, i.e., one or more modules of computer program instructions encoded on a tangible program carrier for execution by, or to control the operation of, data processing apparatus. The tangible program carrier can be a propagated signal or a computer readable medium. The propagated signal is an artificially generated signal, e.g., a machine generated electrical, optical, or electromagnetic signal that is generated to encode information for transmission to suitable receiver apparatus for execution by a computer. The computer readable medium can be a machine readable storage device, a machine readable storage substrate, a memory device, a composition of matter effecting a machine readable propagated signal, or a combination of one or more of them.

The term "processing device" encompasses all apparatus, devices, and machines for processing data or making calculations, including by way of example a programmable processor, a digital signal processor, a computer, or multiple processors or computers. The system processor can include, in addition to hardware, code that creates an execution environment for a computer program, e.g., code that constitutes processor firmware, a protocol stack, a database management system, an operating system, or a combination of one or more of them.

A computer program (also known as a program, software, software application, script, or code) can be written in any form of programming language, including compiled or interpreted languages, or declarative or procedural languages, and it can be deployed in any form, including as a stand-alone program or as a module, component, subroutine, or other unit suitable for use in a computing environment. A computer program does not necessarily correspond to a file in a file system. A program can be stored in a portion of a file that holds other programs or data (e.g., one or more scripts stored in a markup language document), in a single file dedicated to the program in question, or in multiple coordinated files (e.g., files that store one or more modules, sub programs, or portions of code). A computer program can be deployed to be executed on one computer or on multiple computers that are located at one site or distributed across multiple sites and interconnected by a communication network.

The processes and logic flows described in this specification are performed by one or more programmable processors executing one or more computer programs to perform functions by operating on input data and generating output thereby tying the process to a particular machine (e.g., a machine programmed to perform the processes described herein). The processes and logic flows can also be performed by, and apparatus can also be implemented as, special purpose logic circuitry, e.g., an FPGA (field programmable gate array) or an ASIC (application specific integrated circuit).

Computer readable media suitable for storing processor instructions and data include all forms of non volatile memory, media and memory devices, including by way of example semiconductor memory devices, e.g., EPROM, EEPROM, and flash memory devices; magnetic disks, e.g., internal hard disks or removable disks; magneto optical disks; and CD ROM and DVD ROM disks. The processor and the memory can be supplemented by, or incorporated in, special purpose logic circuitry.

To provide for interaction with a user, embodiments of the subject matter described in this specification can be operable to interface with a computing device having a display, e.g., a CRT (cathode ray tube) or LCD (liquid crystal display) monitor, for displaying information to the user and a keyboard and a pointing device, e.g., a mouse or a trackball, by which the user can provide input to the computer. Other kinds of devices can be used to provide for interaction with a user as well; for example, feedback provided to the user can be any form of sensory feedback, e.g., visual feedback, auditory feedback, or tactile feedback; and input from the user can be received in any form, including acoustic, speech, or tactile input.

While this specification contains many specific implementation details, these should not be construed as limitations on the scope of any invention or of what may be claimed, but rather as descriptions of features that may be specific to particular embodiments of particular inventions. Certain features that are described in this specification in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system components in the embodiments described above should not be understood as requiring such separation in all embodiments, and it should be understood that the described program components and systems can generally be integrated together in a single software product or packaged into multiple software products.

Particular embodiments of the subject matter described in this specification have been described. Other embodiments are within the scope of the following claims. For example, the actions recited in the claims can be performed in a different order and still achieve desirable results, unless expressly noted otherwise. As one example, the processes depicted in the accompanying figures do not necessarily require the particular order shown, or sequential order, to achieve desirable results. In some implementations, multitasking and parallel processing may be advantageous.

The invention claimed is:

1. A embedded computer implemented method, comprising:
    receiving a communication signal at an adaptive power control system;
    identifying broadband loading characteristics of the received communication signal at the adaptive power control system;
    identifying output distortion performance parameters of an amplifier associated with a device based upon the broadband loading characteristics of the communication signal received at the adaptive power control system; and
    setting power consumed by the device based upon the identified performance requirements.

2. The computer implemented method of claim 1, further comprising:
    determining whether the loading characteristics of the communication signal are within range;
    using high power settings for the device if the loading characteristics of the communication signal are not within range; and
    wherein the step of identifying performance requirements of the device is performed if the loading characteristics are within range.

3. The computer implemented method of claim 1, wherein the loading characteristics of the communication signal are identified by a broadband power detector.

4. The computer implemented method of claim 1, wherein the loading characteristics of the communication signal are identified based upon reading data within the communication signal.

5. The computer implemented method of claim 1, wherein identifying output distortion performance parameters of the amplifier associated with the device based upon the loading characteristics of the communication signal comprise specifying high power output settings when the signal is heavily loaded.

6. The computer implemented method of claim 1, wherein identifying output distortion performance parameters of the amplifier associated with the device based upon the loading characteristics of the communication signal comprise specifying medium power output settings when the signal is loaded to a medium level.

7. The computer implemented method of claim 1, wherein identifying output distortion performance parameters of the amplifier associated with the device based upon the loading characteristics of the communication signal comprise specifying low power output settings when the signal is lightly loaded.

8. The computer implemented method of claim 1, wherein the loading characteristic of the communication signal is based upon the number of channels used by a multiple service operator and types of signals loaded onto the channels that are used by the multiple service operator.

9. The computer implemented method of claim 1, further comprising amplifying the communication signal based upon the set power output.

10. The computer implemented method of claim 1, further comprising providing information on power consumption to a remote system.

11. A adaptive power control system, comprising:
    a broadband power detector operable to receive a communication signal and to identify loading characteristics of the communication signal;
    a processing module operable receive the loading characteristics of the communication signal and to calculate output distortion performance parameters of an amplifier based upon the loading characteristics of the signal; and
    control signal generator operable to provide control signals to the amplifier thereby controlling the output power of the amplifier based upon the identified performance requirements received from the processing module.

12. The system of claim 11, wherein the processing module is further operable to determine whether the loading characteristics of the communication signal are within range, the processing module being operable to use high power settings for the amplifier if the loading characteristics of the communication signal are not within range, and to calculate performance requirements of the amplifier is performed if the loading characteristics are within range.

13. The system of claim 11, wherein calculation of performance parameters for the amplifier based upon the loading characteristics of the communication signal comprise using high power output settings when the signal is heavily loaded.

14. The system of claim 11, wherein calculation of performance parameters for the amplifier based upon the loading characteristics of the communication signal comprise using medium power output settings when the signal is loaded to a medium level.

15. The system of claim 11, wherein calculation of performance parameters for the amplifier based upon the loading characteristics of the communication signal comprise using low power output settings when the signal is lightly loaded.

16. The system of claim 11, wherein the loading characteristic of the communication signal is based upon the number of channels used by a multiple service operator and types of signals loaded onto the channels that are used by the multiple service operator.

17. The system of claim 11, further comprising an amplifier operable receive the control signals from the power control signal generator and to amplify the communication signal based upon the control signals.

18. The system of claim 11, further comprising a user interface module operable to provide a user interface to a remote system, the user interface comprising information on power consumption of the amplifier.

19. An adaptive power control system, comprising:
    means for identifying loading characteristics of a received communication signal;

means for determining output parameters for an amplifier based upon the identified loading characteristics; and means for providing control signals operable to control a power supply.

20. The adaptive power control system of claim 19, further comprising:

means for amplifying the communication signal based upon the control signals.

* * * * *